US008653636B2

(12) United States Patent
Tanaka et al.

(10) Patent No.: US 8,653,636 B2
(45) Date of Patent: Feb. 18, 2014

(54) CONTACTLESS COMMUNICATION MEDIUM

(75) Inventors: Junsuke Tanaka, Tokyo (JP); Yoshiyuki Mizuguchi, Tokyo (JP)

(73) Assignee: Toppan Printing Co., Ltd., Tokyo (JP)

(*) Notice: Subject to any disclaimer, the term of this patent is extended or adjusted under 35 U.S.C. 154(b) by 10 days.

(21) Appl. No.: 13/391,966

(22) PCT Filed: Aug. 25, 2010

(86) PCT No.: PCT/JP2010/064354
§ 371 (c)(1),
(2), (4) Date: Feb. 23, 2012

(87) PCT Pub. No.: WO2011/024845
PCT Pub. Date: Mar. 3, 2011

(65) Prior Publication Data
US 2012/0193774 A1    Aug. 2, 2012

(30) Foreign Application Priority Data
Aug. 26, 2009  (JP) ................................. 2009-195557

(51) Int. Cl.
*H01L 23/495*    (2006.01)
(52) U.S. Cl.
USPC .................. 257/676; 257/E23.052; 257/678; 257/687; 257/786; 257/666; 257/696; 257/698; 257/691; 257/692; 257/693
(58) Field of Classification Search
USPC .......... 257/676, E23.052, 678, 687, 786, 666, 257/696, 698, 691, 692, 693
See application file for complete search history.

(56) References Cited

U.S. PATENT DOCUMENTS

| 6,233,818 B1 | 5/2001 | Finn et al. |
| 2010/0181381 A1* | 7/2010 | Carrender ..................... 235/488 |
| 2011/0292564 A1* | 12/2011 | Yamazaki .................. 361/301.4 |
| 2012/0126232 A1* | 5/2012 | Yamazaki et al. .............. 257/57 |

FOREIGN PATENT DOCUMENTS

| JP | 10-171956 | 6/1998 |
| JP | 10-198778 | 7/1998 |
| JP | 2000-502477 | 2/2000 |
| JP | 2000-113154 | 4/2000 |
| JP | 2001-101372 | 4/2001 |
| JP | 2004-17561 | * 1/2004 |
| JP | 2005-235150 | 9/2005 |
| JP | 2005-242723 | 9/2005 |
| JP | 2005-242978 | 9/2005 |
| JP | 2008-158915 | 7/2008 |
| JP | 2010-92120 | * 4/2010 |

OTHER PUBLICATIONS

International Search Report for PCT/JP2010/064354 mailed Oct. 12, 2010.

* cited by examiner

*Primary Examiner* — A O Williams

(57) ABSTRACT

A contactless communication medium which can prevent invasion of static electricity and has an outer surface which can satisfy requirements on the flatness thereof. The contactless communication medium has a sealing member including an insulating layer and a conductive layer provided in a stacked manner and having a shape covering an IC module is located such that the insulating layer is on the IC module side. Owing to this, static electricity coming from outside is diffused by the conductive layer and blocked by the insulating layer. Thus, adverse influence of the static electricity on the IC module is prevented. The contactless communication medium can also satisfy the requirements on the flatness of an outer surface thereof.

8 Claims, 4 Drawing Sheets

CONTACTLESS COMMUNICATION MEDIUM

CROSS REFERENCE TO RELATED APPLICATIONS

This is a U.S. National Phase Application under 35 U.S.C. §371 of International Patent Application No. PCT/JP2010/064354 filed Aug. 25, 2010, which claims the benefit of Japanese Patent Application No. 2009-195557, filed Aug. 26, 2009, all of which are hereby incorporated by reference.

TECHNICAL FIELD

The present invention relates to a contactless communication medium.

BACKGROUND ART

Conventionally, a technology of providing an antenna on a substrate and connecting the antenna to an IC module to form a contactless communication medium such as an IC card, an IC tag or the like which can perform data communication with an external read/write device is known.

CITATION LIST

Patent Literature

[PTL 1] Japanese Patent Publication No. 3721520

SUMMARY OF THE INVENTION

Problems to be Solved by the Invention

With the above-described conventional technology, when an inlet including an IC module mounted on an antenna sheet which has an antenna is combined with an insulating substrate or the like and the resultant assembly is used as a contactless communication medium, the substrate is made thick due to the thickness of a sealing resin part or the like containing an IC chip sealed therein. Therefore, the inlet including the IC module mounted on the antenna sheet is combined with a substrate having an opening in positional correspondence with the sealing resin part so that the sealing resin part is accommodated in the opening of the substrate.

If a gap is made between the sealing resin part and an inner side surface of the opening at this point, static electricity may invade the inlet because lines or the like of the inlet are partially exposed to the gap, which may result in adverse influence on the IC module.

In order to prevent such a gap from being made, the following is conceived: the substrate is formed of a flexible and soft material and an outer profile of the opening is made smaller than an external shape of the sealing resin part, so that the sealing resin part is pushed into the opening and pressed.

However, in such a case, the gap is prevented from being made but an external force may act when the sealing resin part is pushed into the opening, which may destroy the IC module. In addition, as a result of the sealing resin part being pushed into the opening, a part of the substrate may run on the sealing resin part. In this case, the IC module may be destroyed by an external force in a stamp test or the like.

Accordingly, in order to allow the sealing resin part of the IC module to be accommodated in the opening, the outer profile of the opening needs to be larger than the external shape of the sealing resin part. Thus, it is difficult to prevent the gap from being made.

An IC card or the like includes an outermost layer held between insulating resin substrates in a laminated manner and thus is not much influenced by static electricity. However, especially in the case where the IC module part is exposed to the outermost layer, as in an electronic passport or the like, or in the case where the IC module part is covered merely with a paper material or the like which is weak against electricity, there is a high undesirable possibility that the IC module is directly influenced by static electricity.

The present invention, made in order to solve the above-described problems, has an object of providing a contactless communication medium which can prevent invasion of static electricity to the IC module with certainty and has an outer surface that is sufficiently flat to satisfy the criterion for passing a flatness test such as a ballpoint pen test or the like.

Solution to the Problems

In order to solve the above-described problems, a contactless communication medium according to the present invention includes a first substrate, a second substrate, an antenna formed on the first substrate or the second substrate, and an IC module connected to the antenna. The first substrate has an opening for accommodating at least a part of the IC module, and a sealing member including an insulating layer and a conductive layer provided in a stacked manner and having a shape covering the IC module is located such that the insulating layer is on the side of the IC module.

According to a contactless communication medium of the present invention, an outer surface of the first substrate and an outer surface of the sealing member are continuous with each other and are generally flat.

According to a contactless communication medium of the present invention, a step between the outer surface of the first substrate and the outer surface of the sealing member is 20 μm or less.

According to a contactless communication medium of the present invention, the sealing member covers a connection part between the antenna and the IC module.

According to a contactless communication medium of the present invention, the IC module includes a lead frame, an IC chip mounted on the lead frame, and a sealing resin part for sealing the IC chip; and at least one of the conductive layer and the insulating layer of the sealing member has a longitudinal elastic modulus which is smaller than that of the sealing resin part.

According to a contactless communication medium of the present invention, the sealing member has a tape structure containing a viscous material.

According to a contactless communication medium of the present invention, the IC module includes a lead frame, an IC chip mounted on the lead frame, and a sealing resin part for sealing the IC chip; and at least one of the viscous material, the conductive layer and the insulating layer has a longitudinal elastic modulus which is smaller than that of the sealing resin part.

According to a contactless communication medium of the present invention, the second substrate includes at least one of an antenna sheet, an inlay sheet and a cover sheet provided in a stacked manner.

Advantageous Effects of the Invention

According to the present invention, a contactless communication medium which can prevent invasion of static electricity and also has an outer surface which can satisfy requirements regarding the flatness thereof.

DESCRIPTION OF EMBODIMENTS

Now, an embodiment of the present invention will be described based on the drawings.

Figure 1:
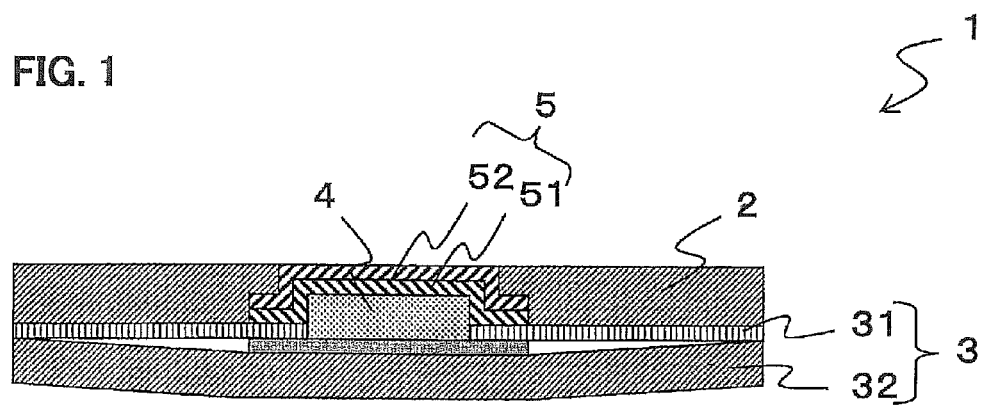
FIG. 1 is a cross-sectional view of an embodiment of a contactless communication medium according to the present invention.

FIG. 1 is a cross-sectional view showing an example of a contactless communication medium 1 according to the present invention. As shown in FIG. 1, a contactless communication medium 1 includes a first substrate 2, a second substrate 3, and an IC module 4. Although not shown, an antenna 61 is formed on the first substrate 2 or the second substrate 3, and is connected to the IC module 4. The first substrate 2 has an opening for exposing the IC module 4, and a sealing member is located between an inner side surface of the opening and the IC module 4 so as to cover the IC module.

FIG. 1 shows an embodiment of the second substrate 3 including an antenna sheet 31 and an inlay sheet 32. The contactless communication medium 1 shown in FIG. 1 has a structure in which an inlet including the antenna sheet 31 of the second substrate 3, the antenna 61 and the IC module 4 is held between the inlay sheet 32 of the second substrate 3 and the first substrate 2. The antenna sheet 31 has a hole, and the IC module 4 is fit into the hole and thus is connected to the antenna 61. In the contactless communication medium, the inlet is held between the inlay sheet 32 and the first substrate 2, and these elements are bonded in a laminated manner and integrated. Thus, the contactless communication medium is formed to have a desired thickness.

It should be noted that the second substrate of the contactless communication medium according to the present invention may be formed of an antenna sheet, may have a double layer structure of an antenna sheet and an inlay sheet, may include a cover sheet in addition to the antenna sheet or the double layer structure of the antenna sheet and the inlay sheet, or may be formed of only a cover sheet. The antenna may be provided on either the first substrate or the second substrate, or on a front surface or a rear surface of the first substrate or the second substrate. In the case where the second substrate has a plurality of layers, the antenna may be provided on any of the plurality of layers or may be provided as being bridged over the plurality of layers. There is no specific limitation on the position of the antenna.

For the first substrate and the inlay sheet of the second substrate, for example, an insulating plastic film (PET-G: noncrystalline copolyester; PVC: vinyl chloride resin, etc.), insulating synthetic paper (polyolefin-based synthetic paper produced by PPG; trade name: "Teslin" (registered trademark); or polypropylene-based synthetic paper produced by Yupo Corporation; trade name: "YUPO" (registered trademark)) or the like is used. The plastic film mentioned above is preferably a flexible plastic film. Regarding the thickness, a material having a thickness of, for example, about 100 μm to about 1000 μm, preferably about 100 μm to about 500 μm is usable. Owing to this, the material can fully exhibit functions as a substrate including a strength and the like, and also is provided with a sufficient flexibility and so is applicable to booklet-shaped uses.

The opening of the first substrate and a window of the second substrate may be formed by punching or the like. A concaved portion may be formed by hot stamping, milling, embossing or the like. Alternatively, after the first substrate and the second substrate are brought together, the window or concaved portion of the second substrate may be sealed in a similar manner to the opening of the first substrate. For sealing, a material substantially the same as that of the above-mentioned sealing member is usable. Alternatively, an adhesive such as a two-liquid curable epoxy resin or the like is usable. Especially where a shock-resistant elastic epoxy resin is used, the IC module can be protected against impacts.

The sealing member 5 includes an insulating layer 51 and a conductive layer 52, and the insulating layer 51 is located on the IC module 4 side. The sealing member 5 including the insulating layer 51 and the conductive layer 52 is located so as to cover the IC module 4 in this manner. Owing to this, when the IC module 4 is subjected to static electricity, the electrons of the static electricity concentrated locally are diffused by the conductive layer 52 and further is blocked by the insulating layer 51. Therefore, the influence of the static electricity on the IC module 4 can be reduced.

The sealing member may have an overall thickness of about 25 μm to 100 μm, and more desirably 80 μm or less, for the following reasons. When the resin material is too thin, the sealing effect is lowered. When the resin material is too thick, a step may be caused when the sealing member is combined with the first substrate.

Materials usable for the insulating layer include, for example, resin materials having electric insulation, heat resistance and moisture resistance. Examples of such resin materials include polyester-based resins, polypropylene-based resins, polyethylene-based resins, polystyrene-based resins, polyimide-based resins and the like. It is especially preferable to use a biaxially stretchable polyester resin. An adhesive such as an epoxy resin or the like is also usable. It is desirable that the insulating layer has a thickness of about 25 μm to 75 μm. When the insulating layer is thinner than this range, the insulating effect is reduced. When the insulating layer is thicker than this range, the overall thickness of the sealing member is increased and a step may be caused when the sealing member is combined with the first substrate. It is desirable that the insulating layer has a dielectric constant of, for example, about 1 to 5 ∈S.

Materials usable for the conductive layer include, for example, conductive polymers and metal thin films having electric insulation, heat resistance and moisture resistance. Examples of such conductive polymers include conductive polyimide, conductive polypyrrole, conductive polyacetylene, conductive polythiophene, conductive polyethylene naphthalate (PEN) and the like. Such a metal thin film may be formed of silver, aluminum, copper or the like by means of printing, application, vapor deposition, sputtering, plating or the like. It is desirable that the conductive layer formed of a conductive polymer has a thickness of about 10 nm to 100 nm, and the conductive layer formed of a metal thin film has a thickness of about 10 nm to 50 μm.

The sealing member in this embodiment is formed such that an outer surface of the first substrate and an outer surface of the sealing member are continuous with each other and are generally flat, and such that the outer surface of the sealing member is generally flush with the outer surface of the first substrate. Specifically, when the surfaces are "generally flat" or "generally flush", it is desirable that the step between the outer surface of the first substrate and the outer surface of the sealing member is 20 μm or less.

The insulating layer and the conductive layer of the sealing member may be formed by, for example, applying or dripping an insulating material and a conductive material in this order. Alternatively, the insulating layer and the conductive layer may be each formed as a resin tape having an adhesive layer and then bonded together. For the adhesive layer, for example, a general viscous material such as an acrylic-based resin or the like is usable. The adhesive layer desirably has a thickness of 10 μm or greater in order to obtain a sufficient level of viscosity, but the thickness may be appropriately adjusted in consideration of the viscosity of the adhesive layer, the overall thickness of the sealing member and the like.

When resin materials are used for the sealing member, it is preferable to use, for at least the insulating layer or the conductive layer, a resin material having a longitudinal elastic modulus smaller than that of the sealing resin part of the IC module. When a resin tape including an adhesive layer is used for the sealing member, it is preferable that at least one of the insulating layer, the conductive layer and the adhesive layer of the resin tape has a longitudinal elastic modulus smaller than that of the sealing resin part of the IC module.

The second substrate of the contactless communication medium according to the present invention may be any substrate including at least one sheet such as an antenna sheet, an inlay sheet, a cover sheet or the like. There is no specific limitation on the structure of the second substrate. In the case where the second substrate is formed of an antenna sheet, the antenna is usually formed on the antenna sheet. In the case where the second substrate is formed of an inlay sheet, a cover sheet or the like, the antenna may be formed on either the first substrate or the second substrate. There is no specific limitation on the position of the antenna as long as the antenna is held between the first substrate and the second substrate or between a plurality of layers included in the second substrate, and is connected to the IC module.

Figure 2:
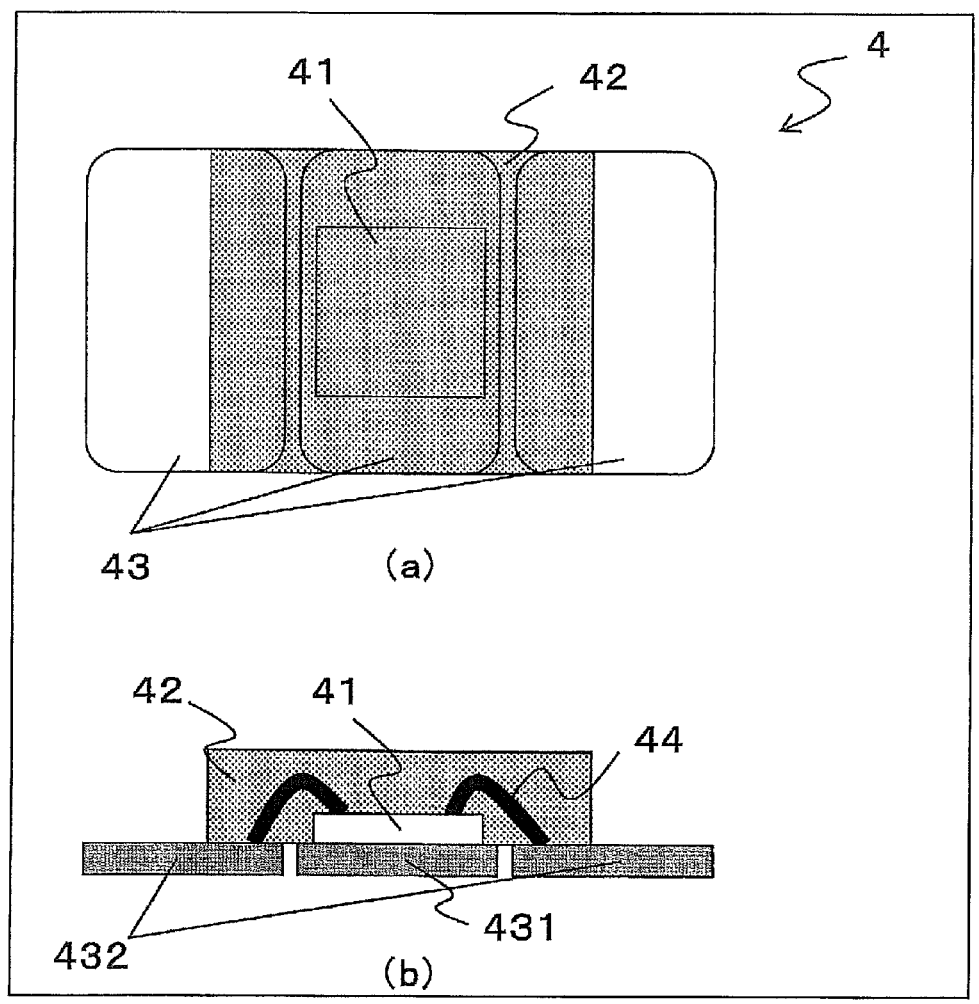
FIG. 2 provides cross-sectional views showing an embodiment of an IC module.

FIG. 2 shows cross-sectional views of the IC module 4 usable for the present invention. (a) of FIG. 2 is a plan view of the IC module 4 in this embodiment, (b) of FIG. 2 is a cross-sectional view thereof.

As shown in (a) of FIG. 2 and (b) of FIG. 2, the IC module 4 includes a lead frame 43, an IC chip 41 mounted on the lead frame 43, and the sealing resin part 42 for sealing the IC chip 41.

The lead frame 43 is formed of, for example, a copper filament metal film or the like obtained by knitting copper filaments into a film form and plating the film form with silver. The lead frame 43 includes a die pad 431 for supporting and fixing the IC chip 41 and terminal parts 432 connected to input/output pads of the IC chip 41.

The die pad 431 is formed to be larger by a certain degree than an outer profile of the IC chip 41, and is fixed to a bottom part of the IC chip 41. The die pad and each terminal part 432 have a gap formed therebetween and are electrically insulated from each other.

The terminal parts are connected to the input/output pads (not shown) of the IC chip 41 via bonding wires 44 of, for example, gold (Au) or the like.

The sealing resin part is formed of, for example, a resin material such as an epoxy resin or the like, and is formed so as to cover the IC chip, the input/output pads of the IC chip, the bonding wires, connection parts of the terminal parts and the bonding wires, and the like. The gaps between the die pad and the terminal parts are also filled with the sealing resin part. The IC module is formed to have a thickness of, for example, about 0.3 mm.

Figure 3:
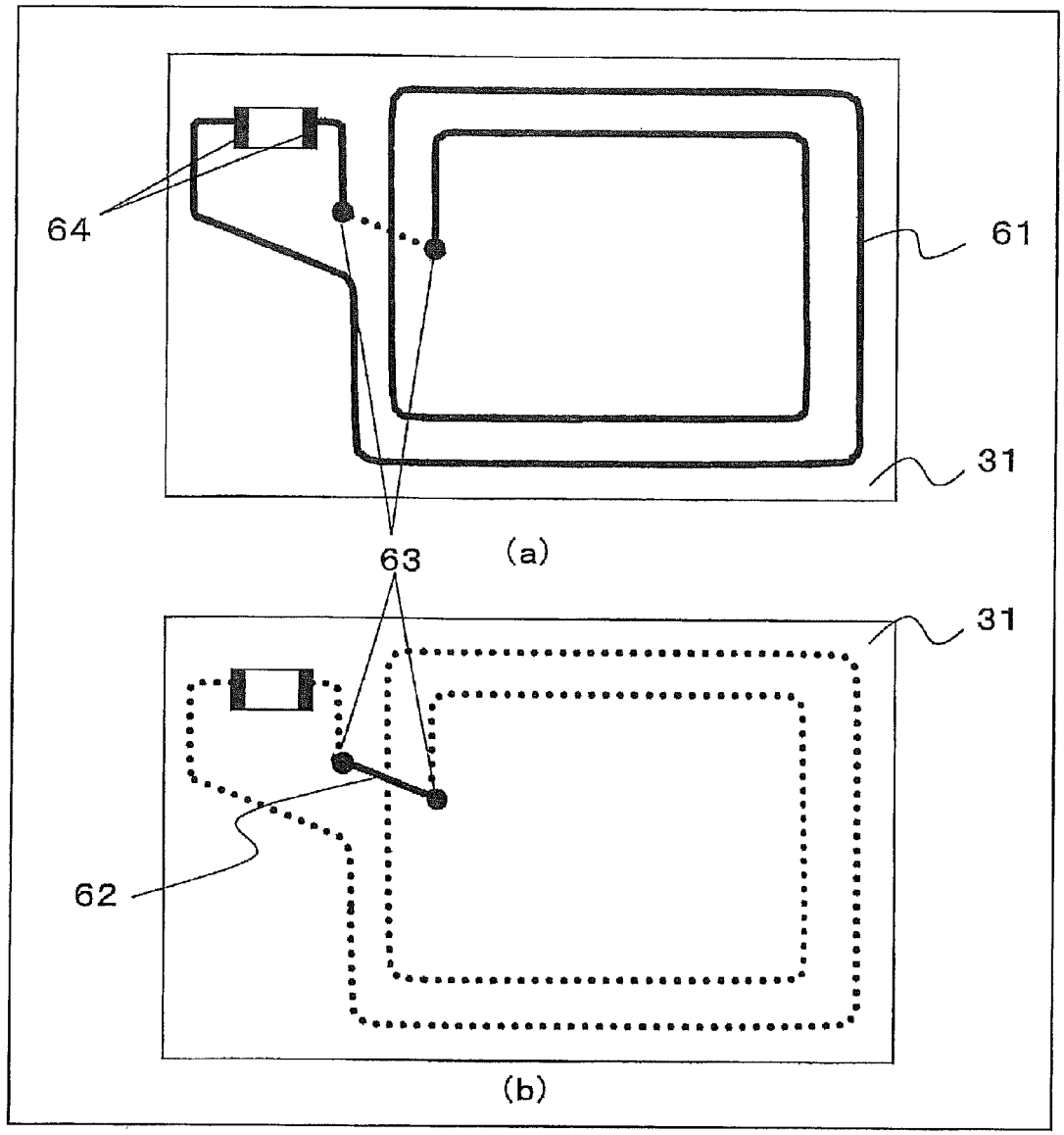
FIG. 3 shows an embodiment of an antenna sheet as an example of a second substrate.

FIG. 3 shows an embodiment of the antenna sheet 31 as an example of the second substrate 3. (a) of FIG. 3 shows a front surface of the antenna sheet 31, and (b) of FIG. 3 shows a rear surface thereof. The antenna sheet 31 is formed of, for example, a flexible material formed of PEN (polyethylene naphthalate) or PET (polyethylene terephthalate). The thickness of the antenna sheet 31 is appropriately selected from a range of, for example, about 0.02 mm to about 0.10 mm. The antenna sheet 31 shown in FIG. 3 is an example of an etched-type antenna formed as the antenna 61. On the front surface of the antenna sheet 31, the antenna 61 is formed, and on the rear surface thereof, a jumper wire 62 is formed.

The antenna 61 and the jumper wire 62 are electrically connected to each other by conduction parts 63 respectively provided therein. It is desirable to form the conduction parts 63 to have a large area size so that the conduction is realized certainly. The conduction of the antenna 61 and the jumper wire 62 is realized by, for example, crimping processing of pressurizing and caulking the antenna 61 and the jumper wire 62 from both sides and breaking the antenna sheet 31, or by forming a through-hole and filling the through-hole with a conductive paste such as a silver paste or the like. There is no specific limitation on the method of conduction as long as the antenna 61 and the jumper wire 62 are physically or electrically connected to each other.

The antenna 61 has connection parts 64 formed to connect the antenna 61 to the IC module 4. It is preferable to form the connection parts 64 to have a large area size so that the connection to the IC module 4 is realized easily. However, the antenna 61 may be formed to have a shape corresponding to a communication characteristic to be used by the contactless communication medium 1. Depending on the type of the antenna 61, the jumper wire 62 may need to be formed on the front surface of the antenna sheet or no jumper wire may be necessary. The shape of the antenna is not limited to that shown in FIG. 3.

The antenna and the jumper wire are preferably, for example, an etched-type antenna formed by forming a thin film having a thickness of about 0.02 mm to 0.05 mm of aluminum, copper, silver or the like on the front surface of the antenna sheet, and patterning the thin film by etching or the like. The reason for this is that when the inlet is subjected to repeated flexure, stress caused by the repeated flexure is applied to parts in which the terminal parts of the IC module are connected to the connection parts of the antenna sheet, which improves the flexibility of the etched-type antenna and prevents stress from being concentrated on a specific site. However, the antenna according to the present invention is not limited to an etched-type antenna, and may be an antenna of a wound coil formed of a conductive wire, an antenna provided with conductive ink by printing, or the like.

The antenna sheet preferably has a window, concaved portion or the like for accommodating the IC module. This further reduces and also uniformizes the thickness of the contactless communication medium, prevents action of a local stress, and improves the resistance against flexure. By allowing even the lead frame of the IC module to be accommodated in the window or concaved portion, the IC module can be fixed. In the case where the parts of the antenna coil to be connected to the IC module are, for example, increased in area size and provided as the connection parts, the connection is realized easily.

The connection parts of the antenna desirably have a width which is generally equivalent to, or slightly smaller than, that of the terminal parts of the IC module. Owing to this, stress can be dispersed in the width direction and can be prevented from being concentrated. In addition, the connection parts of the antenna may be connected, with certainty, over the entire width of the terminal parts of the IC module, and so the reliability of the antenna coil and the inlet can be improved.

The connection parts of the antenna desirably have a length which is larger than that of parts in which the terminal parts of the IC module overlap the connection parts of the antenna. Owing to this, edges of the terminal parts are connected so as to be located at generally central parts of the connection parts of the antenna, which are internal with respect to the ends, on the antenna coil side, of the connection parts of the antenna. Therefore, the edges of the terminal parts contact the generally central parts of the connection parts of the antenna which have a larger width than that of the antenna coil.

On a surface of the second substrate opposite to the surface on which an antenna circuit is formed, reinforcing patterns (not shown) for reinforcing the connection parts of the antenna may be formed in positional correspondence with the areas in which the connection parts of the antenna are formed. Owing to this, the connection parts of the antenna can be supported and reinforced both by the second substrate and the reinforcing patterns formed on the rear surface thereof.

Accordingly, when the parts in which the terminal parts of the IC module and the connection parts of the antenna coil are connected to each other are subjected to repeated flexure, the edges of the terminal parts can be supported by the generally central parts of the connection parts of the antenna having the larger width. Owing to this, the concentration of stress on the antenna coil can be prevented and so breakage of the antenna coil can be prevented.

Figure 4:
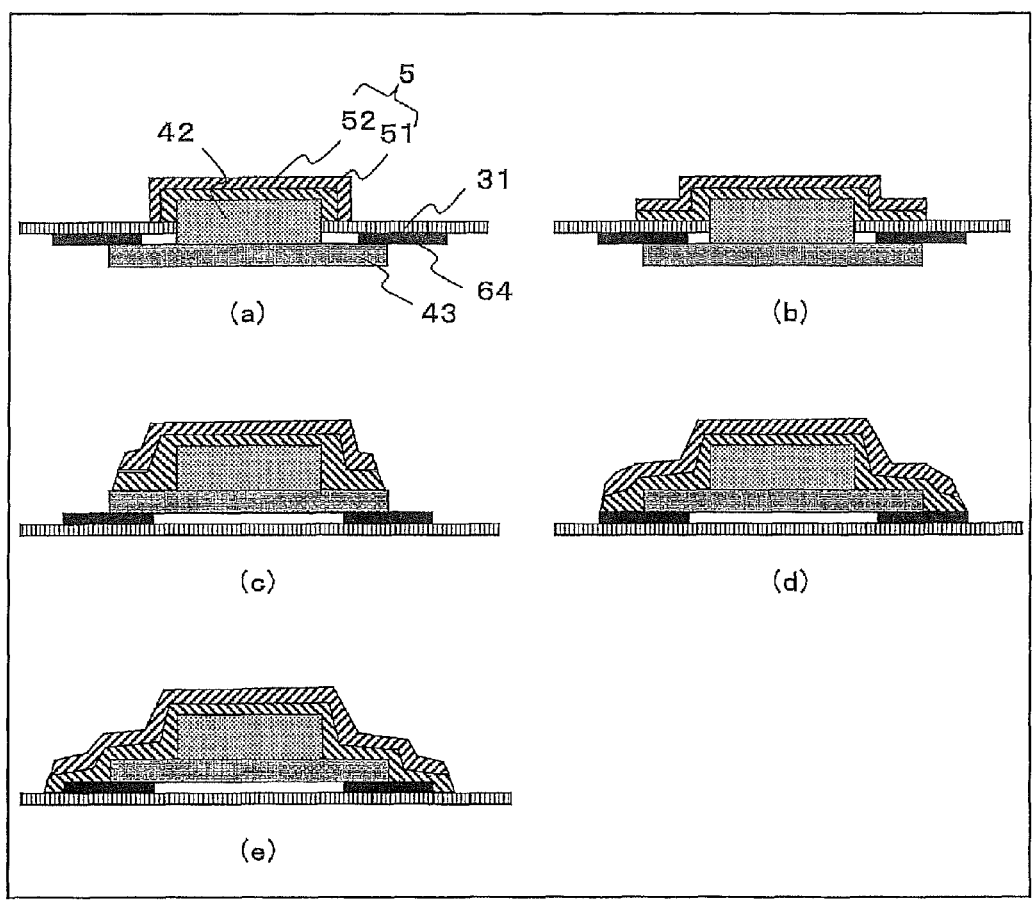
FIG. 4 provides cross-sectional views each showing an embodiment of a manner of locating a sealing member according to the present invention.

FIG. 4 provides cross-sectional views each showing an example of locations of the IC module and the sealing member in the case where the antenna is formed on either the front surface of the rear surface of the second substrate. (*a*) of FIG. 4 through (*d*) of FIG. 4 each show a structure in which the first substrate is to be bonded from above in the figure. In the case where the second substrate includes a plurality of layers, (*a*) of FIG. 4 through (*d*) of FIG. 4 each show one layer closest to the first substrate.

In the case where the antenna is formed on the surface of the second substrate which is opposite to the surface to which the first substrate is bonded, as shown in (*a*) of FIG. 4 and (*b*) of FIG. 4, the IC module is often connected to the antenna on the side of the IC module on which the IC chip is provided. In this case, as shown in (*a*) of FIG. 4, the sealing member may be located so as to cover at least the sealing resin part of the IC module which is exposed to the hole of the second substrate. It is desirable that as shown in (*b*) of FIG. 4, the sealing member is located so as to cover the IC module up to the part which is connected to the antenna, so that the sealing member acts to reinforce the bonding strength.

In the case where the antenna is formed on the surface of the second substrate to which the first substrate is to be bonded, as shown in (*c*) of FIG. 4, (*d*) of FIG. 4 and (*e*) of FIG. 4, the IC module is often connected to the antenna on the side of the IC module opposite to the side on which the IC chip is provided. In this case, as shown in (*c*) of FIG. 4, the sealing member may be located so as to cover at least the IC module. In addition, it is desirable that as shown in (*d*) of FIG. 4, the sealing member is located so as to cover the IC module up to the part which is connected to the antenna, so that the sealing member acts to reinforce the bonding strength. It is also desirable that as shown in (*e*) of FIG. 4, the sealing member is located so as to also cover the entirety of the connection parts of the antenna, so that static electricity can be prevented from flowing to the antenna and thus the IC module is prevented, with certainty, from being adversely influenced by the static electricity.

The cross-section of the sealing member is desirably vertical, inclined or stepped, so that the area size of the conductive layer is smaller than that of the insulating layer and thus the conductive layer does not protrude from the insulating layer. If the conductive layer protrudes from the insulating layer, the conductive layer may directly contact the antenna or the IC module to cause the static electricity to flow. Such a cross-section of the sealing member is obtained by a normal production line with no specific processing for the following reason. A cutting blade used for forming a sealing member has an inclined shape with a pierced tip, and therefore the inclined cross-section of the sealing member is naturally obtained when the cutting is conducted from the side of the conductive layer.

Now, the functions of this embodiment will be described.

In the contactless communication medium in this embodiment, as shown in FIG. 1, the outer profile of the opening of the first substrate is larger than the external shape of the sealing resin part by a certain degree, so that gaps are formed between the inner side surfaces of the opening and the sealing resin part, and the sealing member including the conductive layer and the insulating layer is located so as to fill the gaps, with the insulating layer being provided on the sealing resin part side. Therefore, external static electricity arriving at the IC module is diffused by the conductive layer of the sealing member and further is blocked by the insulating layer with certainty. Thus, the adverse influence of the static electricity on the IC module can be prevented with certainty.

The sealing member covers the lead frame, which is a conductive part of the IC module, in close contact therewith and thus provides a high insulation effect. The sealing member also provides an effect of increasing the bonding strength of the IC module and the antenna.

By filling the gaps with the sealing member, during a flatness test such as a ballpoint pen test, a ballpoint pen is prevented from being caught in the gaps. Thus, the flatness and smoothness of the outer surface of the contactless communication medium formed of the outer surface of the first substrate and the outer surface of the sealing member can be improved.

The sealing member is located so as to cover the outer surface of the IC module. In addition, the outer surface of the first substrate and the outer surface of the sealing member are continuously formed to be generally flat and generally flush with each other. Therefore, even when a step is made between the outer surface of the first substrate and the outer surface of the IC module including the outer surface of the sealing resin part, the outer surface of the first substrate and the outer surface of the sealing member can be generally flush with each other. Accordingly, the flatness and smoothness of the outer surface of the contactless communication medium formed of the outer surface of the first substrate and the outer surface of the sealing member can be improved.

The step between the outer surface of the first substrate and the outer surface of the sealing member is 20 μm or less. Therefore, the outer surface of the contactless communication medium formed of the outer surface of the first substrate and the outer surface of the sealing member can be generally flat and flush with each other. The criterion for passing a flatness test such as a ballpoint pen test or the like can be fully satisfied. The step is more preferably 15 µm or less. Owing to this, the disorder ratio in the ballpoint pen test can be made about 0%.

In the case where a resin tape is used for the sealing member, the positioning of the sealing member is made easier, and so the production process of the contactless communication medium is simplified, the yield is improved, and the production cost is reduced.

It is preferable to form the sealing member of a resin material having a longitudinal elastic modulus smaller than that of the sealing resin part of the IC module. In the case where the sealing member is formed of a resin tape, it is preferable that at least one of the resin material and the viscous material has a longitudinal elastic modulus smaller than that of the sealing resin part of the IC module. In these cases, the impact applied to the contactless communication medium is dispersed to the sealing member as elastic energy. This provides an effect of reducing the impact applied to the IC module. In addition, the sealing member is elastically deformable more easily than the sealing resin part of the IC module. Therefore, even when the outer surface of the first substrate is deformed and recessed by an external force received by the tip of a ballpoint pen in a ballpoint pen test, the sealing member is elastically deformed so as to reduce the step between the outer surface of the first substrate and the outer surface of the sealing member while the tip of the pen moves from a position on the outer surface of the first substrate to a position on the outer surface of the sealing member. Owing to this, stress in the advancing direction of the tip of the ballpoint pen, which is caused due to the step between the outer surface of the first substrate and the outer surface of the sealing member, can be reduced.

As described above, according to the contactless communication medium in this embodiment, invasion of the static electricity can be prevented, and further, the requirements regarding the flatness of the outer surface can be fulfilled.

Now, a method for producing a contactless communication medium according to the present invention will be described.

Herein, a case as shown in FIG. 1 in which the second substrate includes an antenna sheet and an inlay sheet will be described.

Here, the contactless communication medium is produced as follows. For example, first, an IC module is located in a window of the antenna sheet having the antenna formed thereon and is connected with the antenna, thus to form an inlet. A sealing resin part of the IC module is covered with a sealing member. Next, this is held between the inlay sheet and the first substrate, and these elements are stacked such that the IC module is accommodated in an opening made in the first substrate.

Next, a pressing step of pressing the first substrate and the second substrate from outside so that the first substrate and the inlay sheet are mutually pressed is performed. By this pressing step, the first substrate, the second substrate, and the sealing member in the opening are compressed, and the outer surface of the first substrate and the outer surface of the sealing member are formed to be generally flat and generally flush with each other.

In the case where a resin tape is used for the sealing member, the positioning of the sealing member can be made easier, the production steps of the contactless communication medium can be simplified, and the production cost can be reduced.

In the case where the synthetic paper as described above is used for the first substrate and the inlay sheet of the second substrate, the inlet, the first substrate and the inlay sheet are bonded together by an adhesive lamination method as follows. An adhesive is applied to the antenna sheet of the inlet or to a surface of the first substrate and a surface of the inlay sheet which are to contact the antenna sheet, and these elements are bonded together at a relatively low temperature of, for example, about 70° C. to 140° C.

As the adhesive, for example, EVA (ethylene vinyl acetate resin)-based, EAA (ethylene-acrylic acid copolymerizable resin)-based, polyester-based, polyurethane-based or other adhesives are usable.

Instead of applying the adhesive, an adhesive sheet using any of the above-mentioned resins usable as the adhesive may be held between the antenna sheet and the first substrate and between the antenna sheet and the inlay sheet.

In the case where a thermoplastic film is used for the first substrate and the inlay sheet of the second substrate, the inlet, the first substrate and the inlay sheet are bonded together by a thermal lamination method as follows. The inlet and the first substrate, and the inlet and the inlay sheet, are pressurized while being heated to a temperature exceeding the softening temperature of the first substrate and the inlay sheet, for example, about 130° C. to 170° C. to cause melt-bonding. Even when the thermal lamination method is used, any of the above-mentioned adhesives may also be used in order to cause melt-bonding more certainly.

After the inlet, the first substrate and the inlay sheet are bonded together, the external shape of the integrated first substrate, inlay sheet and inlet is processed into a desired shape.

In this manner, the contactless communication medium shown in FIG. 1 can be produced.

In the above embodiment, the pressing step is introduced for producing the contactless communication medium, but the pressing step is not absolutely necessary. Even without the pressing step, the gaps between the IC module and the inner side surfaces of the opening of the substrate may be filled with the sealing member. The outer surface of the substrate and the outer surface of the sealing member can be formed to be flat by use of, for example, a roller, a scraper or the like instead of the pressing step.

Here, regarding the softening temperature of the first substrate and the inlay sheet, the softening temperature of PET-G is about 105° C. to 150° C., and the softening temperature of PVC is about 80° C. to 100° C.

By contrast, the antenna sheet is formed of PEN or PET as described above in the embodiment. The softening temperature of PEN is about 269° C., and the softening temperature of PET is about 258° C. Namely, the heat-resistant temperature can be increased as compared with the thermoplastic material conventionally used for the antenna sheet such as PET-G or the like having a low softening temperature.

Therefore, when the first substrate, the inlay sheet of the second substrate, and the inlet are heated to about 130° C. to 170° C., the first substrate and the inlay sheet are softened but the antenna sheet is not softened. Owing to this, even when the antenna sheet is heated while the inlet including the antenna sheet, the first substrate and the inlay sheet are stacked and bonded by the thermal lamination method, fluidization due to plasticization can be prevented. Accordingly, the movement of the antenna coil due to the fluidization of the antenna sheet can be prevented to improve the reliability of data communication.

Even if the antenna sheet is overheated to a temperature exceeding the softening temperature and as a result, is plasticized and fluidized, if the antenna coil is formed of an etched-type antenna, the contact area size between the antenna coil and the antenna sheet is increased, and the fluidization resistance of the antenna coil can be increased. Therefore, the antenna coil can be prevented from moving along with the fluidization of the antenna sheet, and the reliability of data communication can be improved.

Now, an example of positioning of the sealing member according to the present invention will be described.

Figure 5:
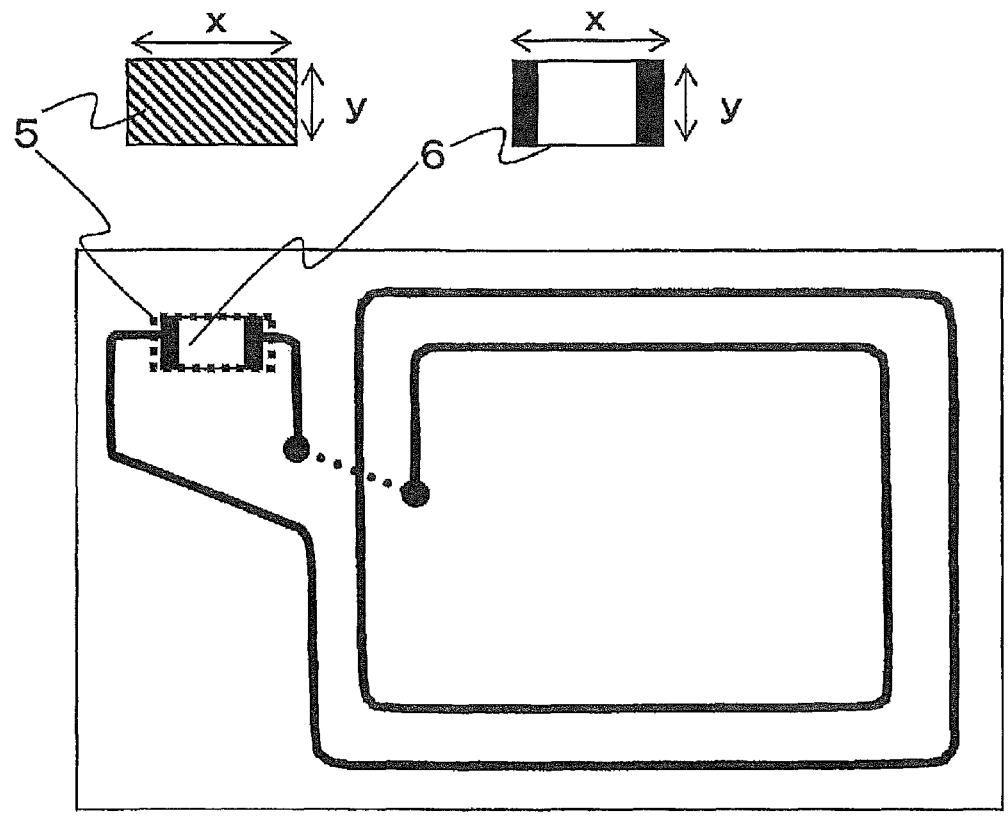
FIG. 5 is a schematic view showing an embodiment of a manner of locating the sealing member according to the present invention.

The sealing member is provided so as to completely cover the IC module. The sealing member may be located so as to contact the second substrate in a direction in which the connection parts of the IC module are arranged (X direction) and in a direction perpendicular to the direction in which the connection parts of the IC module are arranged (Y direction). However, it is preferable to locate the sealing member as follows. As shown in FIG. 5, a lengthy sealing member having a shorter side which is as long as the width of the IC module in the Y direction and a longer side which is longer than the width of the IC module in the X direction is used, and the sealing member is provided so as to cover the connection parts of the IC module, so that the sealing member and the second substrate are bonded to each other in the direction in which the connection parts of the IC module are arranged (X direction) but are not bonded to each other in the direction perpendicular to the direction in which the connection parts of the IC module are arranged (Y direction). Positioning the sealing member in this manner provides the following effect. When being pressed by a roller or the like, the IC module is subjected to a line pressure sequentially from the Y direction. However, since the antenna and the sealing member are not bonded to each other, when an area in the vicinity of the IC module is pressed by the roller, no load is applied to the module via the sealing member. This prevents destruction of the module.

Now, an electronic passport will be described as an example of the contactless communication medium 1 according to the present invention.

Figure 6:
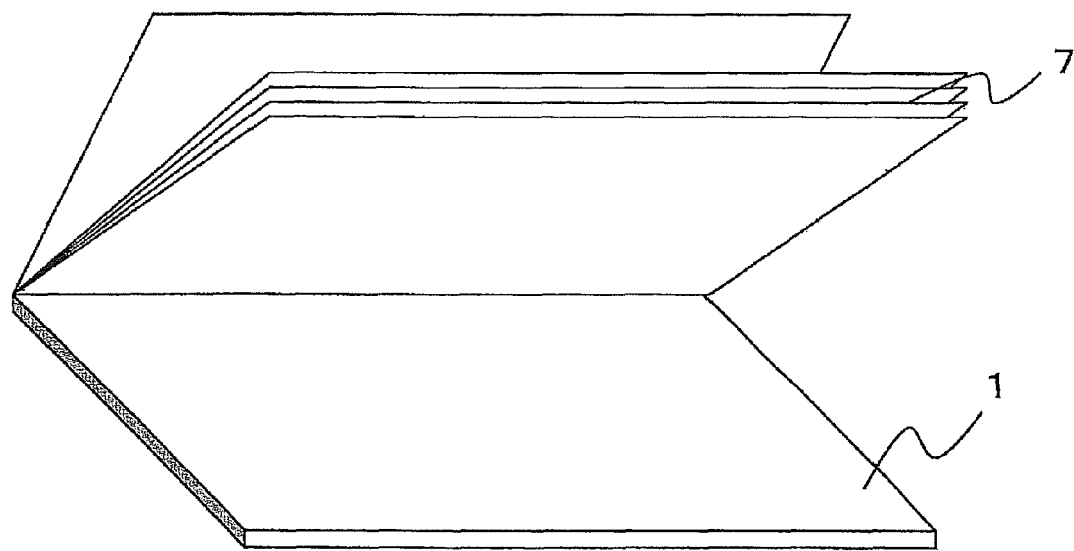
FIG. 6 is a schematic view in the case where a contactless communication medium according to the present invention is an electronic passport.

As shown in FIG. 6, the electronic passport has the above-described contactless communication medium 1 as cover sheets, and has a booklet part 7 held between such cover sheets. To one surface of the contactless communication medium 1, a cover material acting as the cover sheet of the electronic passport is bonded.

A sheet including an antenna sheet, an inlay sheet and a cover sheet bonded together is used as the second substrate of the contactless communication medium. Owing to this, the external appearance and the feel of the electronic passport provided with the contactless communication medium can be made equivalent to those of a conventional passport. The contactless communication medium prevents invasion of the static electricity and has an improved flatness of the outer surface. Therefore, an electronic passport having a high reliability of data communication, improved easiness of writing letters and improved printability of stamps, and a good external appearance can be provided. In the case where only the cover sheet is used as the second substrate and the antenna is formed directly on the cover sheet, the contactless communication medium can be further reduced in thickness and provided with improved flexibility.

In the above embodiment, an electronic passport is described as an example of the contactless communication medium, but the contactless communication medium according to the present invention is usable for, for example, electronic ID documents, various types of electronic certificates of activity history, and the like other than the electronic passports.

Example 1

As the first substrate, polyolefin-based synthetic paper having a thickness of 178 µm and including an opening at a position at which an IC module would be located was used. As the second substrate, an antenna sheet and an inlay sheet formed of polyolefin-based synthetic paper having a thickness of 178 µm were used. An IC module was fit into a hole of the antenna sheet including an antenna, and the hole and the IC module was connected to the antenna.

Then, an aqueous emulsion adhesive (EVA) was applied to the first substrate and the inlay sheet of the second substrate, and a sealing member formed of a resin tape was located on the IC module of the antenna sheet in the state shown in (b) of FIG. 4. The antenna sheet was held between the first substrate and the inlay sheet such that the IC module and the opening of the first substrate would match each other positionally, and these elements were bonded and pressurized to obtain a sample of Example 1. For the sealing member, a resin tape including an insulating layer formed of a 40 µm-thick polyimide layer and a conductive layer formed of a 0.2 µm-thick conductive polypyrrole film provided in a stacked manner and also containing a 15 µm-thick acrylic resin-based viscous material layer was used.

Six such samples 1-1, 1-2, 1-3, 1-4, 1-5 and 1-6 were produced.

The cross-section of each obtained contactless communication medium was measured with an electronic microscope. In any of the samples, there was no gap between the inner side surfaces of the opening of the first substrate and the sealing resin part of the IC module. The step between the outer surface of the sealing member covering the IC module and the outer surface of the first substrate was smaller than 20 µm.

Next, a static electricity test was performed on the obtained samples in conformity with ISO10373-7 and JIS X6305-7.

First, the direction of the longer side of the rectangle of the contactless communication medium was set as the right-left direction, and the direction of the shorter side thereof was set as the up-down direction. Each sample was located such that the first substrate would be on top and the opening would be at the upper right corner of the rectangle as seen in a plan view. From the outer surface of the substrate having the opening, voltages of +6 kV, −6 kV, +8 kV, −8 kV, +10 kV and −10 kV were sequentially applied. Each time a different voltage was applied, the basic operation of the IC chip was confirmed, and the communication response of the contactless communication medium was measured.

The voltages for the sequential measurement were applied at 25 positions in total, namely, 20 areas (position: 20) obtained by dividing a rectangular area which was enclosed by the antenna coil as an outer perimeter and was longer in the transverse direction into 4 in the longitudinal direction and into 5 in the transverse direction (4×5), the center of the sealing resin part of the IC module (center position), a position on the substrate left to the opening (left position), a position on the substrate right to the opening (right position), a position on the substrate upper to the opening (upper position), and a position on the substrate lower to the opening (lower position).

Table 1 shows the measurement results of the static electricity test. In Table 1, symbol "○" represents that the communication response was good; and symbol "X" represents that communication response disorders occurred. "20" represents data at position 20, "M" represents data at the center position, "L" represents data at the left position, "R" represents data at the right position, "Up" represents data at the upper position, and "Un" represents data at the lower position.

TABLE 1

| | | +6 kV | | | | | | −6 kV | | | | | | +8 kV | | | | | |
|---|---|---|---|---|---|---|---|---|---|---|---|---|---|---|---|---|---|---|---|
| | | 20 | M | L | R | Up | Un | 20 | M | L | R | Up | Un | 20 | M | L | R | Up | Un |
| Example 1 | 1-1 | ○ | ○ | ○ | ○ | ○ | ○ | ○ | ○ | ○ | ○ | ○ | ○ | ○ | ○ | ○ | ○ | ○ | ○ |
| | 1-2 | ○ | ○ | ○ | ○ | ○ | ○ | ○ | ○ | ○ | ○ | ○ | ○ | ○ | ○ | ○ | ○ | ○ | ○ |
| | 1-3 | ○ | ○ | ○ | ○ | ○ | ○ | ○ | ○ | ○ | ○ | ○ | ○ | ○ | ○ | ○ | ○ | ○ | ○ |
| | 1-4 | ○ | ○ | ○ | ○ | ○ | ○ | ○ | ○ | ○ | ○ | ○ | ○ | ○ | ○ | ○ | ○ | ○ | ○ |
| | 1-5 | ○ | ○ | ○ | ○ | ○ | ○ | ○ | ○ | ○ | ○ | ○ | ○ | ○ | ○ | ○ | ○ | ○ | ○ |
| | 1-6 | ○ | ○ | ○ | ○ | ○ | ○ | ○ | ○ | ○ | ○ | ○ | ○ | ○ | ○ | ○ | ○ | ○ | ○ |
| Example 2 | 2-1 | ○ | ○ | ○ | ○ | ○ | ○ | ○ | ○ | ○ | ○ | ○ | ○ | ○ | ○ | ○ | ○ | ○ | ○ |
| | 2-2 | ○ | ○ | ○ | ○ | ○ | ○ | ○ | ○ | ○ | ○ | ○ | ○ | ○ | ○ | ○ | ○ | ○ | ○ |
| | 2-3 | ○ | ○ | ○ | ○ | ○ | ○ | ○ | ○ | ○ | ○ | ○ | ○ | ○ | ○ | ○ | ○ | ○ | ○ |
| | 2-4 | ○ | ○ | ○ | ○ | ○ | ○ | ○ | ○ | ○ | ○ | ○ | ○ | ○ | ○ | ○ | ○ | ○ | ○ |
| | 2-5 | ○ | ○ | ○ | ○ | ○ | ○ | ○ | ○ | ○ | ○ | ○ | ○ | ○ | ○ | ○ | ○ | ○ | ○ |
| | 2-6 | ○ | ○ | ○ | ○ | ○ | ○ | ○ | ○ | ○ | ○ | ○ | ○ | ○ | ○ | ○ | ○ | ○ | ○ |
| Comparative example 1 | A-1 | ○ | ○ | ○ | ○ | ○ | x | | | | | | | | | | | | |
| | A-2 | ○ | ○ | ○ | ○ | ○ | ○ | ○ | ○ | x | | | | | | | | | |
| | A-3 | ○ | ○ | ○ | ○ | ○ | ○ | ○ | ○ | ○ | ○ | ○ | ○ | ○ | ○ | ○ | x | | |
| | A-4 | ○ | ○ | ○ | ○ | ○ | ○ | ○ | ○ | ○ | ○ | ○ | ○ | ○ | ○ | ○ | ○ | ○ | x |
| | A-5 | ○ | ○ | ○ | ○ | ○ | ○ | ○ | ○ | ○ | ○ | ○ | ○ | ○ | ○ | ○ | x | | |
| | A-6 | ○ | ○ | ○ | ○ | ○ | ○ | ○ | ○ | ○ | ○ | ○ | ○ | ○ | ○ | ○ | ○ | ○ | x |

| | | −8 kV | | | | | | +10 kV | | | | | | −10 kV | | | | | |
|---|---|---|---|---|---|---|---|---|---|---|---|---|---|---|---|---|---|---|---|
| | | 20 | M | L | R | Up | Un | 20 | M | L | R | Up | Un | 20 | M | L | R | Up | Un |
| Example 1 | 1-1 | ○ | ○ | ○ | ○ | ○ | ○ | ○ | ○ | ○ | ○ | ○ | ○ | ○ | ○ | ○ | ○ | ○ | ○ |
| | 1-2 | ○ | ○ | ○ | ○ | ○ | ○ | ○ | ○ | ○ | ○ | ○ | ○ | ○ | ○ | ○ | ○ | ○ | ○ |
| | 1-3 | ○ | ○ | ○ | ○ | ○ | ○ | ○ | ○ | ○ | ○ | ○ | ○ | ○ | ○ | ○ | ○ | ○ | ○ |
| | 1-4 | ○ | ○ | ○ | ○ | ○ | ○ | ○ | ○ | ○ | ○ | ○ | ○ | ○ | ○ | ○ | ○ | ○ | ○ |
| | 1-5 | ○ | ○ | ○ | ○ | ○ | ○ | ○ | ○ | ○ | ○ | ○ | ○ | ○ | ○ | ○ | ○ | ○ | ○ |
| | 1-6 | ○ | ○ | ○ | ○ | ○ | ○ | ○ | ○ | ○ | ○ | ○ | ○ | ○ | ○ | ○ | ○ | ○ | ○ |
| Example 2 | 2-1 | ○ | ○ | ○ | ○ | ○ | ○ | ○ | ○ | ○ | ○ | ○ | ○ | ○ | ○ | ○ | ○ | ○ | ○ |
| | 2-2 | ○ | ○ | ○ | ○ | ○ | ○ | ○ | ○ | ○ | ○ | ○ | ○ | ○ | ○ | ○ | ○ | ○ | ○ |
| | 2-3 | ○ | ○ | ○ | ○ | ○ | ○ | ○ | ○ | ○ | ○ | ○ | ○ | ○ | ○ | ○ | ○ | ○ | ○ |
| | 2-4 | ○ | ○ | ○ | ○ | ○ | ○ | ○ | ○ | ○ | ○ | ○ | ○ | ○ | ○ | ○ | ○ | ○ | ○ |
| | 2-5 | ○ | ○ | ○ | ○ | ○ | ○ | ○ | ○ | ○ | ○ | ○ | ○ | ○ | ○ | ○ | ○ | ○ | ○ |
| | 2-6 | ○ | ○ | ○ | ○ | ○ | ○ | ○ | ○ | ○ | ○ | ○ | ○ | ○ | ○ | ○ | ○ | ○ | ○ |
| Comparative example 1 | A-1 | | | | | | | | | | | | | | | | | | |
| | A-2 | | | | | | | | | | | | | | | | | | |
| | A-3 | | | | | | | | | | | | | | | | | | |
| | A-4 | | | | | | | | | | | | | | | | | | |
| | A-5 | | | | | | | | | | | | | | | | | | |
| | A-6 | | | | | | | | | | | | | | | | | | |

As shown in Table 1, in this example, a good communication response was obtained with all of samples 1-1 through 1-6, at all the voltages and at all the positions.

Next, a ballpoint pen test was performed on the samples. The ballpoint pen test was performed by allowing a ballpoint pen to run on the outer surface of the first substrate in the direction of the longer side of the antenna coil so as to pass over the IC module. A commercially available ballpoint pen having a diameter of 1 mm was used. The ballpoint pen was allowed to run at a load of 600 g and a rate of 25 mm/sec. After the ballpoint pen was run in a reciprocating motion 25 times, the basic operation of the IC chip was confirmed, and the communication response of the contactless communication medium was measured.

Table 2 shows the measurement results of the ballpoint pen test. In Table 2, "OK" represents that the communication response was good; and "NG" represents that communication response disorders occurred.

TABLE 2

| | | |
|---|---|---|
| Example 1 | 1-1 | OK |
| | 1-2 | OK |
| | 1-3 | OK |
| | 1-4 | OK |
| | 1-5 | OK |
| | 1-6 | OK |

TABLE 2-continued

| | | |
|---|---|---|
| Example 2 | 2-1 | OK |
| | 2-2 | OK |
| | 2-3 | OK |
| | 2-4 | OK |
| | 2-5 | OK |
| | 2-6 | OK |
| Comparative Example 1 | A-1 | NG |
| | A-2 | NG |
| | A-3 | OK |
| | A-4 | OK |
| | A-5 | NG |
| | A-6 | NG |

As shown in Table 2, in this example, a good communication response was obtained with all of samples 1-1 through 1-6.

A stamp test was performed on the samples. The stamp test was performed by applying a load on the outer surface of the substrate having the opening using a stamp.

The diameter of the tip of the punch of the stamp used was 10 mm. After an impact of a load of 250 g was applied 50 times at a height of fall of 320 mm, the basic operation of the IC chip was confirmed, and the communication response of the contactless communication medium was measured.

Table 3 shows the measurement results of the stamp test. In Table 3, "OK" represents that the communication response was good; and "NG" represents that communication response disorders occurred.

TABLE 3

| Example 1 | 1-1 | OK |
|---|---|---|
|  | 1-2 | OK |
|  | 1-3 | OK |
|  | 1-4 | OK |
|  | 1-5 | OK |
|  | 1-6 | OK |
| Example 2 | 2-1 | OK |
|  | 2-2 | OK |
|  | 2-3 | OK |
|  | 2-4 | OK |
|  | 2-5 | OK |
|  | 2-6 | OK |
| Comparative Example 1 | A-1 | NG |
|  | A-2 | NG |
|  | A-3 | NG |
|  | A-4 | NG |
|  | A-5 | NG |
|  | A-6 | NG |

As shown in Table 3, in this example, a good communication response was obtained with all of samples 1-1 through 1-6.

Example 2

Samples were produced in substantially the same method as in Example 1 except that for the sealing member, a tape including an insulating layer formed of a 45 μm-thick polyester layer and a conductive layer formed of a 100 nm-thick silver paste and also containing a 30 μm-thick urethane-based viscous material layer was used.

Six such samples 2-1, 2-2, 2-3, 2-4, 2-5 and 2-6 were produced.

The cross-section of each obtained contactless communication medium was measured with an electronic microscope. In any of the samples, there was no gap between the inner side surfaces of the opening of the first substrate and the sealing resin part of the IC module. The step between the outer surface of the sealing member covering the IC module and the outer surface of the first substrate was smaller than 20 μm.

The above-described static electricity test was performed. As shown in Table 1, a good communication response was obtained with all of samples 2-1 through 2-6, at all the voltages and at all the positions.

The above-described ballpoint pen test was performed. As shown in Table 2, a good communication response was obtained with all of samples 2-1 through 2-6. The stamp test was performed. As shown in Table 3, a good communication response was obtained with all of samples 2-1 through 2-6.

Comparative Example 1

Samples were produced in substantially the same method as in Example 1 except that the sealing member was not used.

Six such samples A-1, A-2, A-3, A-4, A-5 and A-6 were produced.

The cross-section of each obtained contactless communication medium was measured with an electronic microscope. In all the samples, gaps of about 50 μm were made between the inner side surfaces of the opening of the first substrate and the IC module, and the step between the outer surface of the sealing resin part of the IC module and the outer surface of the substrate having the opening was larger than 20 μm.

The above-described static electricity test was performed. As shown in Table 1, communication response disorders occurred in sample A-1 at a voltage of +6 kV applied to the lower position (Un). In sample A-2, communication response disorders occurred at a voltage of −6 kV applied to the left position (L). In sample A-3, communication response disorders occurred at a voltage of +8 kV applied to the right position (R). In sample A-4, communication response disorders occurred at a voltage of +8 kV applied to the lower position (Un). In sample A-5, communication response disorders occurred at a voltage of +8 kV applied to the right position (R). In sample A-6, communication response disorders occurred at a voltage of +8 kV applied to the lower position (Un).

The ballpoint pen test was performed. As shown in Table 2, communication response disorders occurred in samples A-1, A-2, A-5 and A-6, but a good communication response was obtained with samples A-3 and A-4.

The stamp test was performed. As shown in Table 3, communication response disorders occurred in all of samples A-1 through A-6.

Based on the above-described results, in the example according to the present invention using the sealing member, invasion of the static electricity through the gaps can be prevented and thus the disorder ratio in the static electricity test can be made about 0%. By fulfilling the flatness requirements on the outer surface, the disorder ratio in the ballpoint pen test and the stamp test can be made about 0%. By contrast, in Comparative Example 1 in which the sealing member is not used, the probability that the communication response disorders occur after each of the tests is very high.

| DESCRIPTION OF THE REFERENCE CHARACTERS | |
|---|---|
| 1 | contactless communication medium |
| 2 | first substrate |
| 3 | second substrate, |
| 31 | antenna sheet, |
| 32 | inlay sheet |
| 4 | IC module; |
| 41 | IC chip, |
| 42 | sealing resin part, |
| 43 | lead frame, |
| 431 | die pad, |
| 432 | terminal part, |
| 44 | bonding wire |
| 5 | sealing member, |
| 51 | insulating layer, |
| 52 | conductive layer |
| 61 | antenna, |
| 62 | jumper wire, |
| 63 | conduction part, |
| 64 | connection part |
| 7 | booklet part |

The invention claimed is:

1. A contactless communication medium, comprising:
a first substrate;
a second substrate laminated on the first substrate;
an antenna formed on the first substrate or the second substrate; and
an IC module connected to the antenna, wherein the first substrate has an opening accommodating at least a part of the IC module,
a sealing member including an insulating layer and a conductive layer provided in a stacked manner and having a shape covering the IC module is located such that the insulating layer is on the side of the IC module, and in the opening, the IC module, the insulating layer, and the conductive layer are located in this order from a side of the opening proximate to the second substrate.

2. The contactless communication medium according to claim 1, wherein an outer surface of the first substrate and an outer surface of the sealing member are continuous with each other and are generally flat.

3. The contactless communication medium according to claim 2, wherein a step between the outer surface of the first substrate and the outer surface of the sealing member is 20 μm or less.

4. The contactless communication medium according to claim 1, wherein the sealing member covers a connection part between the antenna and the IC module.

5. The contactless communication medium according to claim 1, wherein:
   the IC module includes a lead frame, an IC chip mounted on the lead frame, and a sealing resin part for sealing the IC chip; and
   at least one of the conductive layer and the insulating layer of the sealing member has a longitudinal elastic modulus which is smaller than that of the sealing resin part.

6. The contactless communication medium according to claim 1, wherein the sealing member has a tape structure containing a viscous material.

7. The contactless communication medium according to claim 6, wherein:
   the IC module includes a lead frame, an IC chip mounted on the lead frame, and a sealing resin part for sealing the IC chip; and
   at least one of the viscous material, the conductive layer and the insulating layer has a longitudinal elastic modulus which is smaller than that of the sealing resin part.

8. The contactless communication medium according to claim 1, wherein the second substrate includes at least one of an antenna sheet, an inlay sheet and a cover sheet provided in a stacked manner.

\* \* \* \* \*